United States Patent
Bayer et al.

(10) Patent No.: US 6,797,939 B2
(45) Date of Patent: Sep. 28, 2004

(54) METHOD FOR MONITORING PLASMA OR FLAME-SPRAY PROCESSES

(75) Inventors: Erwin Bayer, Dachau (DE); Jörg Höschele, Friedrichshafen (DE); Stefan Schneiderbanger, Lauterbach (DE); Jürgen Steinwandel, Uhldingen-Mühlhofen (DE)

(73) Assignees: MTU Aero Engines GmbH, München (DE); DaimlerChrysler AG, Stuttgart (DE)

( * ) Notice: Subject to any disclaimer, the term of this patent is extended or adjusted under 35 U.S.C. 154(b) by 194 days.

(21) Appl. No.: 10/219,816

(22) Filed: Aug. 16, 2002

(65) Prior Publication Data

US 2003/0052259 A1 Mar. 20, 2003

(30) Foreign Application Priority Data

Aug. 16, 2001 (DE) .......................................... 101 40 299

(51) Int. Cl.$^7$ ................................................ G01J 3/50
(52) U.S. Cl. ........................................ 250/226; 250/554
(58) Field of Search ................................. 250/226, 216, 250/227.18, 227.23, 227.24, 554, 339.06, 339.07; 356/73.1, 315, 316

(56) References Cited

U.S. PATENT DOCUMENTS

| | | | |
|---|---|---|---|
| 5,986,277 A | | 11/1999 | Bourque et al. |
| 6,081,323 A | * | 6/2000 | Mahgerefteh et al. ..... 356/73.1 |

FOREIGN PATENT DOCUMENTS

| | | |
|---|---|---|
| DE | 19950982 A1 | 4/2000 |
| DE | 69514051 | 8/2000 |
| EP | 0 542 542 B1 | 5/1993 |

* cited by examiner

Primary Examiner—Que T. Le
(74) Attorney, Agent, or Firm—Crowell & Moring LLP

(57) ABSTRACT

A method for measuring characteristic properties of a plasma beam in a thermal spraying process, wherein the spraying materials are fed into the plasma (1) and the luminous radiation emitted by the plasma (1) is reproduced on optical fibers (2). The luminous radiation is reproduced on the one end (2a) of the optical fibers (2) arranged in a one-dimensional or two-dimensional array (6). Spectral analysis of the luminous radiation transmitted in the optical fiber (2) is accomplished with a spectrometer (3) arranged at the other end (2b) of an optical fiber (2). The frequency spectrums are analyzed in a processor (5) to determine the contemporaneous condition of the spraying process.

11 Claims, 1 Drawing Sheet

METHOD FOR MONITORING PLASMA OR FLAME-SPRAY PROCESSES

This application claims the priority of German Application No. 101 40 299.6-52, filed Aug. 16, 2001, the disclosure of which is expressly incorporated by reference herein.

BACKGROUND AND SUMMARY OF THE INVENTION

The invention relates to a method for monitoring plasma or flame-spray processes.

A method for contemporaneous (on-line) measurement of powder spray particles in a plasma beam is known from European Patent EP 0 542 542 B1. The luminous radiation emitted by the plasma beam is focused on the end of a fiber optical waveguide. At the other end of the fiber optical waveguide, the luminous radiation is divided into two light beams, each of which is fed into a photo detector, by means of a dichroic lens. In the photo detectors, the intensity distribution over time is determined for each light beam. A filter installed ahead of the photo detectors provides that suitable wavelength ranges can be filtered out of the luminous radiation and their intensity progression over time determined.

European Patent EP 0 542 542 B1 also describes the option of using a waveguide bundle and of feeding the received radiation to a CCD camera.

Another method for determining the intensity distribution over time of luminous radiation emitted by plasma is known from U.S. Pat. No. 5,986,277.

The disadvantage of these known methods is that it is only possible to determine the intensity distribution of the luminous radiation of the plasma. In addition, only the velocity and temperature of the particles can be determined with the known methods. Consequently, the known methods allow for only limited monitoring and diagnosis of the contemporaneous plasma condition. It is not possible to monitor the other process parameters relevant to the spraying process. In addition to those described above (velocity and temperature of the particles), the process parameters that define the plasma condition include plasma composition, composition of the spraying materials, and the flow of the melt and other materials.

The object of the invention is to provide a method which makes it possible to determine other parameters contemporaneously, in addition to the velocity and temperature of the particles.

According to the invention, the luminous radiation is reproduced on one end of the optical fibers arranged in a one-dimensional or two-dimensional array. In addition, also according to the invention, spectral analysis of the luminous radiation transmitted in the optical fiber is accomplished with a spectrometer arranged at the other end of the optical fiber. The spectrums are analyzed in a processor, such as a data processing system, to determine the process parameters of the spraying process. The analysis of the spectrums is accomplished with a method known to a person skilled in the art.

In contrast to the prior art, the progression of an entire spectrum over time can be determined for any optical fiber with the method of the invention. A spectral resolution of individual image points (formed by the individual optical fibers) along the plasma beam can be achieved with the spectrometer. Because of its small size, a spectrometer positioned on a plug-in card for a data processing system (PC) can advantageously be used as the spectrometer.

It is also possible to identify power spray materials as well as gas and liquid precursors, as well as to determine their progression over time, based on characteristic spectral lines in the measured spectrums. The corresponding spectral lines can be independently determined for each optical fiber. Consequently, it is especially possible to examine the plasma beam over space and time with respect to its contemporaneous process condition by means of the process of the invention.

Another advantage of the present invention is the ability to simultaneously determine the velocities of several different particles contained in the plasma beam. Several different gas and material flows in the plasma beam can also be determined simultaneously. This is especially advantageous when not only a powder material, but also, for example, a powder mixture is used as the spraying material.

The method of the invention can also be used to determine the stability of the plasma beam, which exerts a decisive influence on the quality of the spraying process.

In an advantageous embodiment of the invention, it is possible to sequentially feed the luminous radiation of the individual optical fibers in the array of the invention to a single spectrometer. This array can, in particular, be a linear array or a square or rectangular array, such as one with a 4×4 or 5×5 matrix.

In this process, each optical fiber in the array is sequentially scanned, so that the luminous radiation is sequentially fed into the spectrometer. The advantage of this process lies in substantial space and cost savings with respect to the components required for the process. Switching the individual optical fibers to the spectrometer can be accomplished without significant loss of time by means of switches known to the person skilled in the art.

Thus, comprehensive monitoring and on-line diagnosis of a thermal spraying process is possible with the method of the invention.

In another advantageous embodiment of the invention, it is possible to regulate the process parameters of the spraying process by means of the process condition determined on the basis of the spectrums. In doing so, it is, for example, possible to regulate the gas and material flows of the plasma beam and of the spraying material fed into the plasma.

Other objects, advantages and novel features of the present invention will become apparent from the following detailed description of the invention when considered in conjunction with the accompanying drawings.

BRIEF DESCRIPTION OF THE DRAWINGS

The invention is explained in detail below on the basis of drawings.

DETAILED DESCRIPTION OF THE PREFERRED EMBODIMENTS

Figure 1:
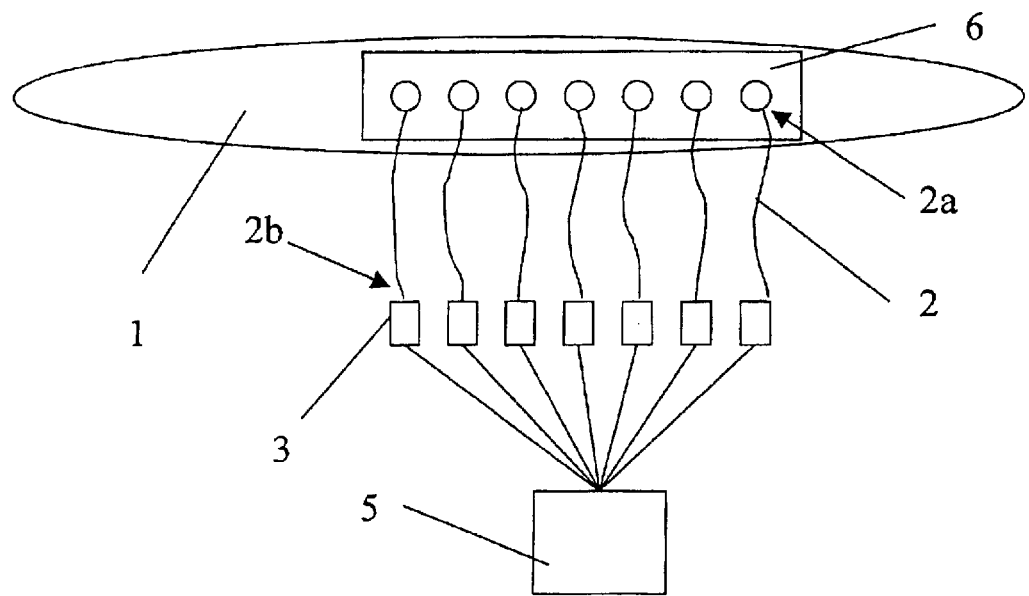
FIG. 1 depicts a first embodiment for execution of the method of the invention.

FIG. 1 depicts a first embodiment for execution of the method of the invention, in which the optical fibers 2 are arranged in an exemplary one-dimensional array 6. Naturally, a two-dimensional array is also possible. The light irradiated by the plasma 1 is reproduced on the one end 2a of the optical fibers 2. At the other end 2b of each optical fiber 2, the light of the plasma 1 transported in the optical fiber is separated into its spectral components in a corresponding spectrometer 3. The frequency spectrums generated in the individual spectrometers 3 are processed further in a processor 5, such as a computer.

Figure 2:
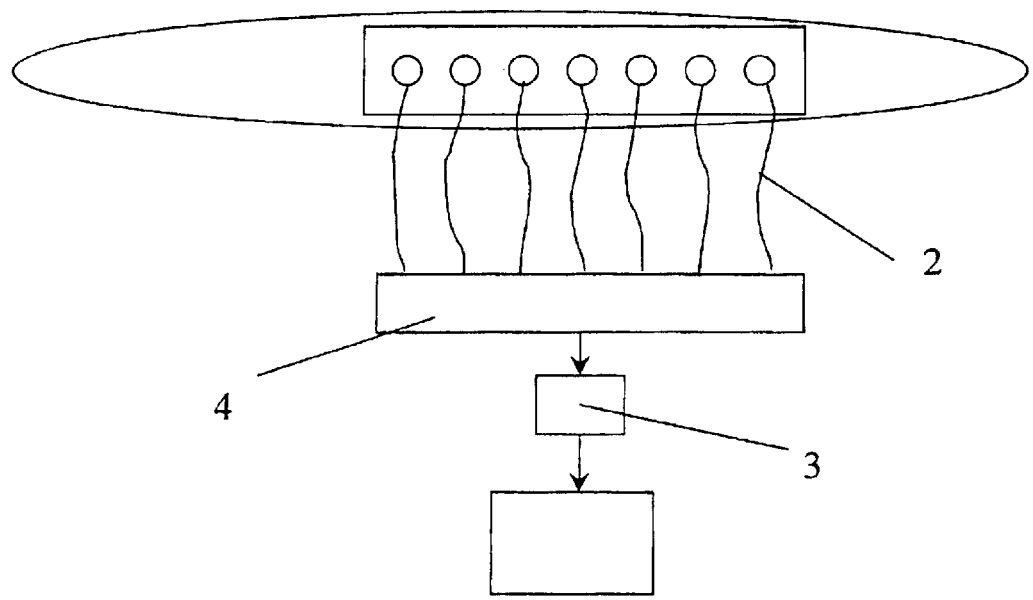
FIG. 2 depicts a second embodiment for execution of the method of the invention.

A second embodiment for execution of the method of the invention is depicted in FIG. 2, with the arrangement essentially corresponding to the arrangement described in FIG. 1. In the embodiment depicted in FIG. 2, however, the individual optical fibers 2 are fed into a distributor circuit 4. This distributor circuit 4 then sequentially guides the information in the individual optical fibers 2 to the spectrometer 3. The distributor circuit 4 can, of course, be controlled by a control circuit 7.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for measuring characteristic properties of a plasma beam in a thermal spraying process, said method comprising the steps of:

feeding spraying materials into a plasma;

reproducing luminous radiation emitted by the plasma on one end of optical fibers arranged in one of a one-dimensional and two-dimensional array;

performing spectral analysis of the luminous radiation transmitted in the optical fibers with a spectrometer arranged at another end of the optical fibers; and analyzing the frequency spectrums provided by the spectral analysis in a processor to determine the contemporaneous condition of the spraying process.

2. The method according to claim 1, wherein the luminous radiation of the individual optical fibers in the array is sequentially fed into a spectrometer.

3. The method according to claim 1, wherein the process parameters of the spraying process, are regulated by means of the process condition determined on the basis of the spectrums.

4. The method according to claim 2, wherein the spectrometer is positioned on a plug-in card for a data processing system.

5. The method according to claim 2, wherein the process parameters of the spraying process, are regulated by means of the process condition determined on the basis of the spectrums.

6. The method according to claim 3, wherein the process parameters include at least one of gas and material flow.

7. The method according to claim 5, wherein the process parameters include at least one of gas and material flow.

8. An apparatus for measuring characteristics properties of a plasma beam in a thermal spraying process, said apparatus comprising:

an array of optical fibers for receiving light irradiated by a plasma at one end of the array and outputting transmitted light at another end of the fiber;

a spectrometer device connected to said another end of said array of optical fibers for separating light from said fibers into spectral components; and processing device for analyzing said spectral components.

9. The apparatus according to claim 8, wherein said spectrometer device includes a plurality of spectrometer elements each associated with a respective one of said optical fibers of the array.

10. The apparatus according to claim 8 further including a distribution circuit positioned between said optical fiber and said spectrometer device for guiding each optical fiber output to said spectrometer.

11. The apparatus according to claim 10 including a control circuit for controlling the operation of said distribution circuit.

* * * * *